United States Patent [19]

Suverison et al.

[11] Patent Number: 4,981,443
[45] Date of Patent: Jan. 1, 1991

[54] DIAGNOSTIC CONNECTOR TAP

[75] Inventors: Lyle B. Suverison, Fowler; Detlev H. von Schwerdtner, Hudson, both of Ohio

[73] Assignee: General Motors Corporation, Detroit, Mich.

[21] Appl. No.: 454,558

[22] Filed: Dec. 21, 1989

[51] Int. Cl.[5] .............................................. H01R 4/24
[52] U.S. Cl. ..................................................... 439/398
[58] Field of Search ................................. 439/389–426

[56] References Cited

U.S. PATENT DOCUMENTS

| | | | |
|---|---|---|---|
| 2,408,045 | 9/1946 | Cottrell | 173/340 |
| 3,020,260 | 2/1962 | Nelson | 260/46.5 |
| 3,388,370 | 6/1968 | Elm | 339/98 |
| 3,718,888 | 2/1973 | Pasternak | 339/98 |
| 3,824,530 | 7/1974 | Roberts et al. | 439/398 |
| 3,836,944 | 9/1974 | Lawson | 339/99 R |
| 4,066,321 | 1/1978 | Villazon | 439/398 |
| 4,130,331 | 12/1978 | Neff et al. | 339/97 R |
| 4,159,158 | 6/1979 | Weidler | 439/398 |
| 4,195,898 | 4/1980 | Chow et al. | 339/99 R |
| 4,504,699 | 3/1985 | Dones et al. | 174/84 |
| 4,662,692 | 5/1987 | Uken et al. | 339/96 |
| 4,685,756 | 8/1987 | Gamarra | 439/426 |
| 4,875,870 | 10/1989 | Hardy et al. | 439/204 |

Primary Examiner—Joseph H. McGlynn
Attorney, Agent, or Firm—F. J. Fodale

[57] ABSTRACT

A diagnostic connector tap comprises a insulation displacement terminal which is disposed in an insulator housing which has an integrally hinged cap. The diagnostic connector tap is permanently attached to an insulated electrical cable for electrical testing of the insulated electrical cable simply by placing the cable in positioning slots of the terminal and closing the cap until it is locked in the closed position which automatically establishes an electrical connection between the terminal and the conductive core of the insulated electrical cable. The insulated electrical cable is then tested by inserting a test probe through a probe aperture which provides access to the terminal inside the closed insulator housing. The electrical connection between the terminal and the conductive core of the insulated electrical cable is preferably sealed by a sealant gel which is contained in the closed housing.

21 Claims, 3 Drawing Sheets

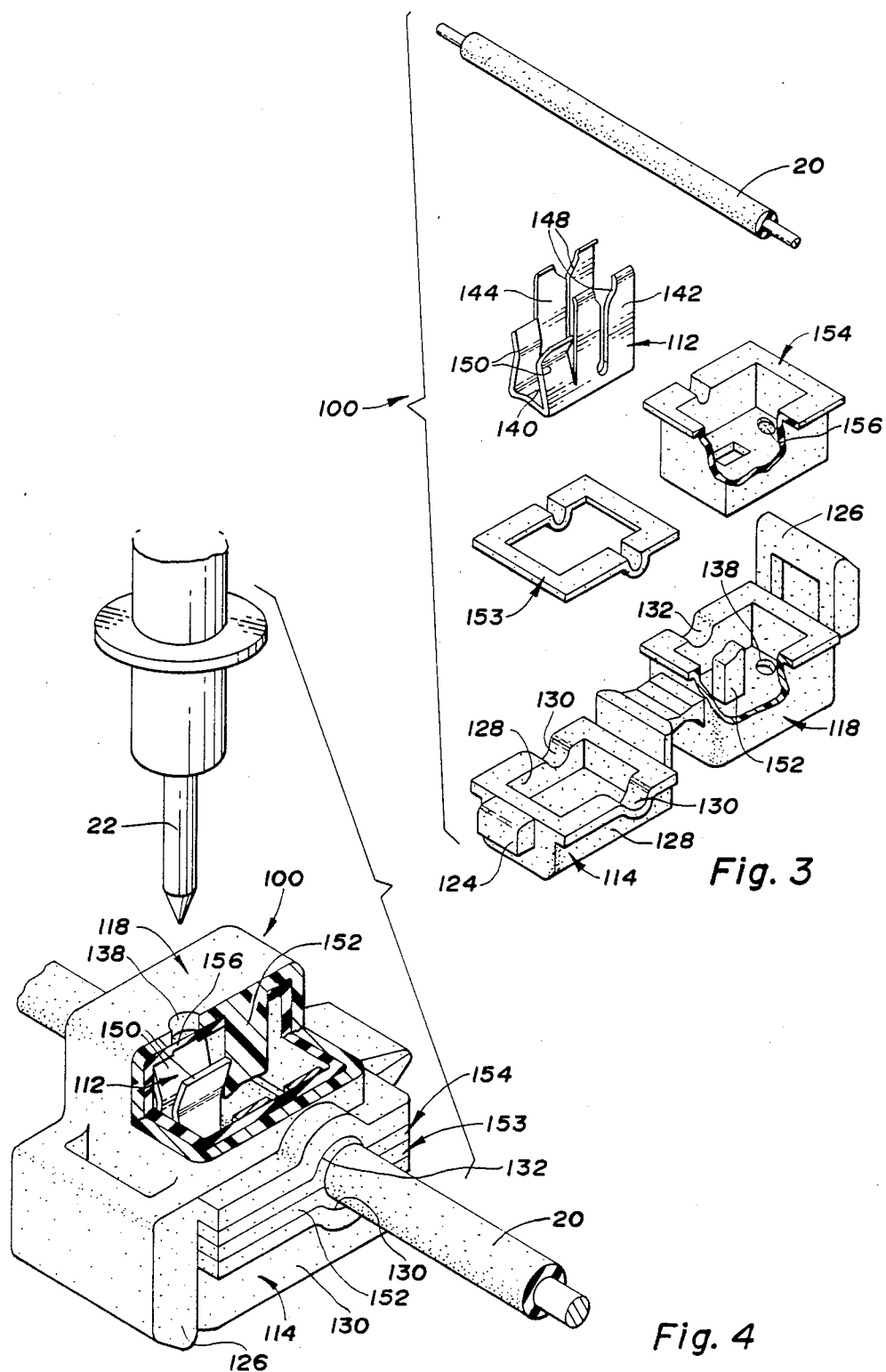

DIAGNOSTIC CONNECTOR TAP

BACKGROUND OF THE INVENTION

This invention relates generally to electrical connectors and more specifically to a diagnostic connector tap which can be clamped around an insulated electrical cable which is in service for testing the insulated electrical cable while it is in service.

U.S. Pat. No. 2,408,045 granted to Turner R. Cottrell Sept. 24, 1946 discloses a line connector for testing the condition of telephone lines using insulated conductors. The Cottrell line connector comprises two complimentary hinged jaws equipped with semi-cylindrical grooves approximately equal to the outer diameter of the line wire. The grooves of one jaw are provided with sharp contact pins which establish electrical connections with the inner conductors after the line wires are placed in the grooves and then squeezed between the jaws. The line connector must be disconnected from the line wires after each use and there is no provision for repairing the insulation of the wires because the openings made by the sharp pins are not considered objectionable.

It is also known from U.S. Pat. No. 4,195,898 granted to Weichien Chow and Josef Keglewitsch Apr. 1, 1980 to provide a patchcord connector which has widened entrances at the cable end of the connector housing to provide limited access for inserting a test probe to engage and test the terminals of the patchcord connector.

SUMMARY OF THE INVENTION

The object of this invention is to provide a simple and economical diagnostic connector tap which can be permanently attached to an insulated electrical cable thereby eliminating the need for disconnection after the test or for reconnection for subsequent tests.

Another object of this invention is to provide a diagnostic connector tap which can be easily installed in the field without special tooling for testing of insulated electrical cables while the cables are in service.

Another object of this invention is to provide a diagnostic connector tap which is small and compact so that the tap can be installed in crowded places such as the engine compartment of an automobile.

Yet another object of this invention is to provide a diagnostic connector tap which seals the connection interface with the conductive core of the insulated electrical cable so that the diagnostic connector tap can be used on insulated electrical cables which carry very low currents in harsh environments such those which are located in engine compartments for feeding electronic control devices.

Other objects and features of the invention will become apparent to those skilled in the art as disclosure is made in the following detailed description of a preferred embodiment of the invention which sets forth the best mode of the invention contemplated by the inventors and which is illustrated in the accompanying sheets of drawing.

BRIEF DESCRIPTION OF THE DRAWINGS

FIG. 3 is an exploded perspective view of a second embodiment of a diagnostic connector tap in accordance with our invention.

FIG. 4 is a sectioned perspective view of the diagnostic connector tap of FIG. 3 attached to an insulated electrical cable.

DETAILED DESCRIPTION OF THE PREFERRED EMBODIMENT

Figure 1:
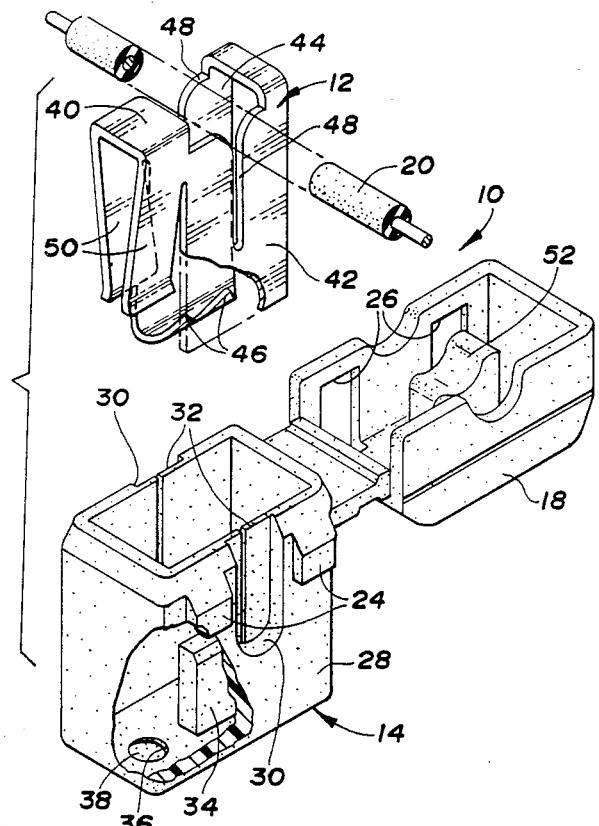
FIG. 1 is an exploded perspective view of a first embodiment of a diagnostic connector tap in accordance with our invention.
Figure 2:
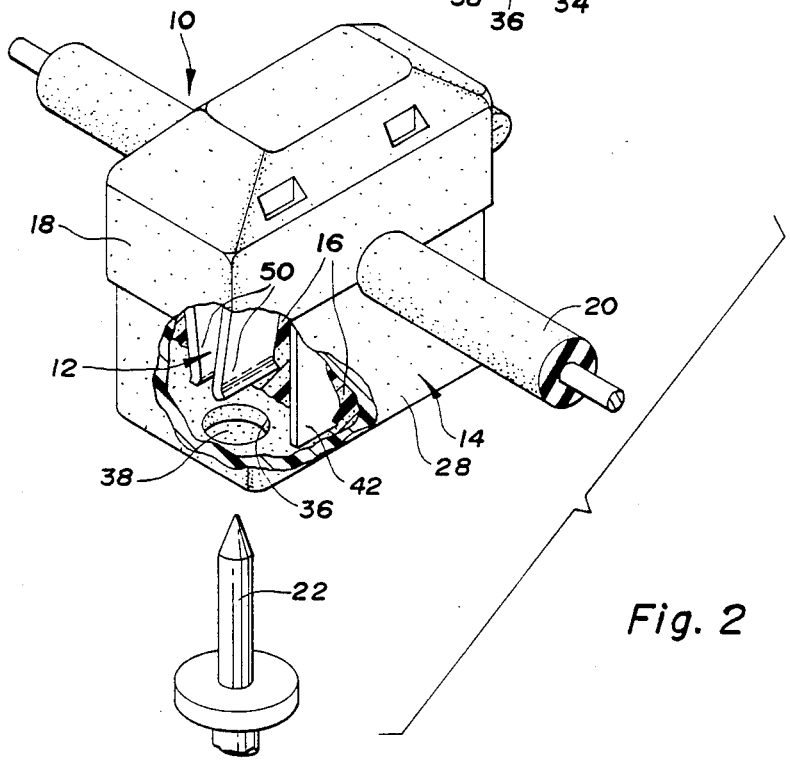
FIG. 2 is a sectioned perspective view of the diagnostic connector tap of FIG. 1 attached to an insulated electrical cable.

Referring now to the drawing and more particularly to FIGS. 1 and 2 a first embodiment of a diagnostic connector tap in accordance with our invention is indicated generally at 10. The diagnostic connector tap 10 comprises a terminal 12 which is disposed in an insulator housing 14 which is filled with a sealant gel 16 and which has an integrally hinged cap 18. This diagnostic connector tap may be attached to an insulated electrical cable 20 for electrical testing of the insulated electrical cable simply by placing the cable in positioning slots of the terminal 12 and closing the cap 18 until it is locked in the closed position which automatically establishes an electrical connection between the terminal 12 and the conductive core of the insulated electrical cable 20. The insulated electrical cable 20 may then be tested simply by inserting a test probe 22 into the insulator housing 14 through a probe aperture which provides access to a contact of the terminal 12. The electrical connection between the terminal 12 and the conductive core of the insulated electrical cable 20 is sealed by the sealant gel 16 so that the diagnostic connector tap 10 may be left on the insulated electrical cable 20 for future diagnostic tests.

The insulator housing 14 of the diagnostic connector tap 10 has front, back and side walls, a bottom wall and an open top as shown in FIG. 1. The cap 18 is hinge connected to the back wall of the insulator housing by an integral living hinge for movement between an open position shown in FIG. 1 and a closed position shown in FIG. 2. The cap 18 is locked in the closed position where it covers the open top of the insulator housing 14 by lock nibs 24 engaging internal lock shoulders 26 of the cap 18.

Each of the side walls 28 of the insulator housing 14 has an elongated slot 30 which communicates with the open top and extends downwardly for receiving the insulated electrical cable 20. These slots are closed off by thin sealing webs 32 which retain the sealant gel 16 in the insulator housing 14 during the liquid filling operation and subsequent set-up. The webs 32 are slit in the elongated or downward direction of the slots 30 so that the insulated electrical cable 20 can be pushed down into the slots 30 when the diagnostic connector tap 10 is closed and clamped on the cable 20 as shown in FIG. 2.

The bottom wall of the insulator housing 14 has an internal rib 34 which is parallel to the side walls 14 and closer to right hand side wall as shown in FIG. 1. The internal rib 34 is used to lock the terminal 12 in the insulator housing 14 and the offset position of the internal rib 34 insures that the terminal 12 is correctly oriented in the insulator housing 14.

The bottom wall of the insulator housing 14 also includes a probe aperture 36 which is located forwardly of the rib 34 and which is closed by a thin frangible sealing web 38. The thin frangible sealing web 38 which also retains the sealant gel 16 during the filling operation and subsequent set-up is easily penetrated by the test probe 22 when the device 20 is clamped on the cable 20 for the diagnostic test.

The terminal 12 is U-shaped as shown in FIG. 1 and disposed in the insulator housing as shown in FIG. 2. It has a bridge portion 40 which is at the open top of the insulator housing 14 and depending plates 42 and 44 which are disposed between the rib 34 and the respective side walls 28. As indicated above, the rib 34 insures that the terminal 12 is correctly oriented in the insulator housing 14 and it is also engaged by claws 46 at the bottom of the plate 44 to retain the terminal 12 in the insulator housing 14.

The plates 42 and 44 have identically shaped slots 48 which are aligned with the elongated slots 30 of the insulator housing 14. These identically shaped slots 48 have upper V-shaped portions which communicate with a gap in the bridge portion 40 for positioning the insulated electrical cable 20 across the open end of the insulator housing 14 and on top of the terminal 12; and lower insulation piercing portions of narrow width for piercing the insulation of the insulated electrical cable 10 when it is so positioned and pushed down into the insulator housing 14 when closing cap 18.

The cap 18 has a depending anvil 52 which fits through the gap in the bridge portion 40 of the U-shaped terminal 12 and between the plates 42, 44 and pushes the insulated electrical cable 20 which is positioned in the V-shaped portion of the slots 48 down into the insulation piercing portions when the cap is closed.

The U-shaped terminal 12 further includes a pair of spring fingers 50 depending from the bridge portion 40. These spring fingers 50 operate independently of the plates 42, 44 and provide a contact which is aligned with the probe aperture 36 in the bottom wall of the insulator housing 14. The spring fingers 50 press against opposite diametrical portions of the test probe 22 when it is inserted between the spring fingers 50 through the aperture 36.

The insulator housing 14 contains a sealant in gel form, such as Dow Corning Corporation's Sylgard 527 silicone dielectric gel. After the terminal 12 is retained in the insulator housing 14 by the claws 46, this sealant is poured into the insulator housing 14 as a liquid. The liquid does not escape through the cable slots 30 or the probe aperture 36 due to the presence of the webs 32 and 38 which retain the liquid until it sets up into a gel form. Once the sealant has been set up as a gel, the integrity of the webs can be destroyed without effecting sealing efficiency of the sealant. Consequently, the electrical interface between the terminal 12 and the conductive core of the insulated electrical cable 2C is still effectively sealed by the sealant gel 16 in spite of the fact that the webs 32 have been spread apart by the cable 20 and the web 38 has been pierced by the test probe 22. Moreover, the diagnostic connector tap 10 can be left on the cable 20 after test due to its small size and low cost. This maintains the sealing presence of the sealant gel 16 and eliminates the need for installing a new tap for subsequent tests.

A second embodiment of a diagnostic connector tap in accordance with our invention is indicated generally at 100 in FIGS. 3 and 4. This second embodiment receives the test probe 22 through the top. It comprises a modified terminal 112, a shallower insulator housing 114 and a deeper cap 118.

The modified terminal 112 also has depending plates 142 and 144 which have identical slots 148 for piercing the insulation of the insulated electrical cable 20. However, the depending plates 142 and 144 are connected by a bridge portion 140 which is attached to the solid or unslotted ends of the of the plates 142 and 144. The terminal 112 is placed in the insulator housing 114 with the bridge portion 140 resting on the bottom wall of the insulator housing 114 and the side plates 142 and 144 projecting well above the short side walls 128. The slots 130 in the side walls 128 are part circular and complement part circular slots 132 of the cap 118 for sealing around the insulated conductor cable 20 when the cap 118 is closed as shown in FIG. 4.

As before, the cap 118 includes a depending anvil 152 which fits between the plates 142 and 144 and pushes the insulated conductor cable 20 positioned in the upper V-shaped portions of the slots 148 down into the narrow insulation piercing portions when the cap 118 is closed. The cap 118 is locked in the closed position by an integral latch arm 126 which engages a nib 124 of the insulator housing 114.

The modified cap 118 also includes a probe aperture 138 which is in front of the depending anvil 152 and which is aligned with the probe contact fingers 150 of the terminal 112 in the closed position of the cap 118.

The interface between the insulator housing 114 and the cap 118 is sealed by cooperating liners of silicone or other suitable sealing material. The liners 153 and 154 are preferably molded on the insulator housing 114 and the cap 118 respectively even though the liners are shown as separate elements in FIG. 3. In either event, the liner 154 includes a thin frangible web portion 156 which covers the probe aperture 138 until it is pierced by the test probe 22.

This second embodiment may have a variation in which the liners 153 and 154 are replaced by a sealant gel which is contained in the housing 114 and cap 118. In such an event the mating faces of the insulator housing 114 and the cap 118 are reshaped so as to fit snugly around the cable 20 in the absence of the liners and the frangible web portion 156 is molded as an integral part of the cap 118.

Figure 5:
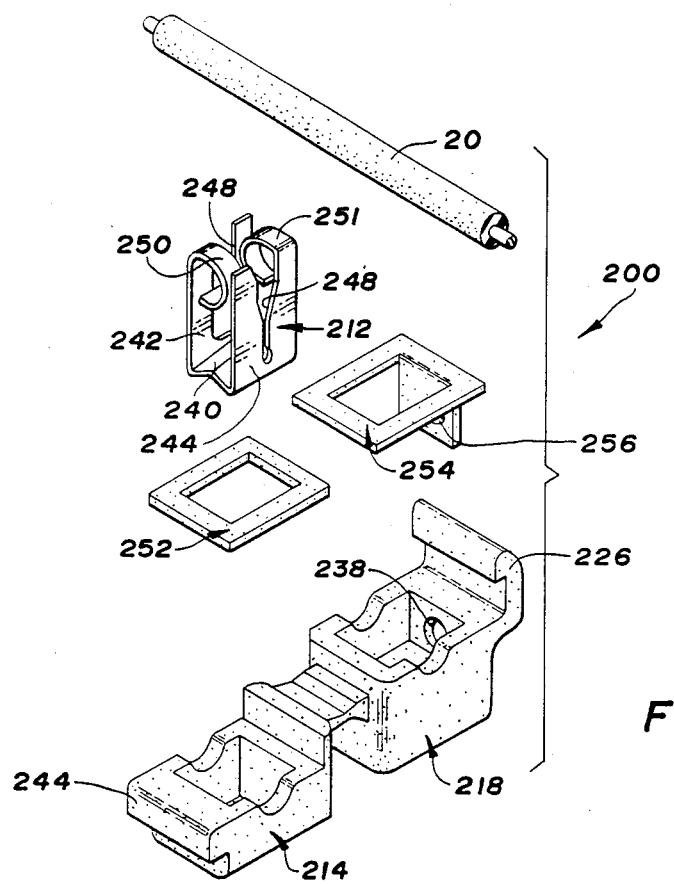
FIG. 5 is an exploded perspective view of a third embodiment of a diagnostic connector tap in accordance with our invention.
Figure 6:
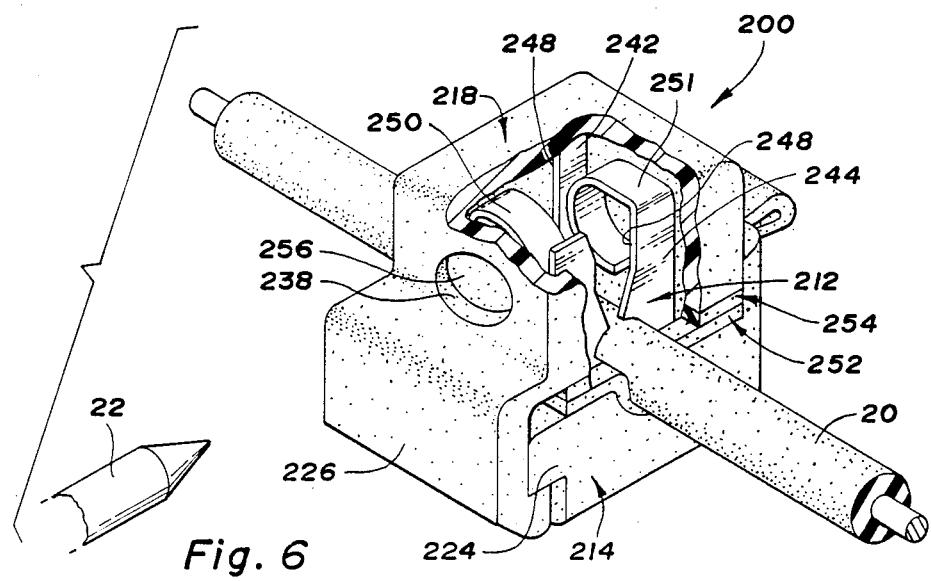
FIG. 6 is a sectioned perspective view of the diagnostic connector tap of FIG. 5 attached to an insulated electrical cable.

A third embodiment of a diagnostic connector tap in accordance with our invention is indicated generally at 200 in FIGS. 5 and 6. This third embodiment receives the test probe 22 through the front and it is shorter than the first and second embodiments because of a still further modified terminal 212, insulator housing 214, and cap 218.

This further modified terminal 212 still has depending plates 242 and 244 which have identical slots 248 for piercing the insulation of the insulated electrical cable 20 and which are connected by a bridge portion 240 which is attached to the solid or unslotted ends of the of the plates 242 and 244. However, the probe contact is in the form of a pair of U-shaped spring fingers 250 and 251 which are integrally attached at the free ends of the respective plates 242 and 244. The U-shaped spring fingers 250 and 251 are disposed one behind the other between the plates 242 and 244 and open in opposite directions so that the U-shaped spring fingers press against diametrically opposite portions of the test probe 22 when it is inserted through the U-shaped spring fingers 250 and 251.

This modified cap 218 also includes a probe aperture 238 but the probe aperture 238 is located in a front wall of the cap 218 so that it aligns with the U-shaped probe contact fingers 250 and 251 when the cap 218 is closed and locked in the closed position by an integral latch arm 226 which engages a nib 224 of the insulator housing 214 as shown in FIG. 6.

This third embodiment may also have cooperating liners 252 and 254 of silicone or other suitable sealing material which are preferably molded on the insulator housing 214 and the cap 218. As before, the liner 254 includes a thin frangible web portion 256 which covers the probe aperture 238 until it is pierced by the test probe 22.

The liners 252 and 253 may be replaced by a sealant gel in this third embodiment in which case the mating faces of the insulator housing 214 and the cap 218 are also reshaped so as to fit snugly around the cable 20 in the absence of the liners and the frangible web portion 256 again is molded as an integral part of the cap 218.

We wish it to be understood that we do not desire to be limited to the exact details of construction shown and described, for obvious modifications will occur to a person skilled in the art.

The embodiments of the invention in which an exclusive property or privilege is claimed are defined as follows:

1. A diagnostic connector tap which is adapted for permanent attachment to an insulated electrical cable for in service testing of the insulated electrical connector by an electrical test probe comprising:
    an insulator housing having front, back and side walls, a bottom wall and an open top;
    a cap which is hinge connected to the back wall of the insulator housing for movement between an open position and a closed position covering the open top of the insulator housing,
    each of the side walls having a slot which communicates with the open top for receiving an insulated electrical cable extending across the open top of the insulator housing,
    one of the insulator housing and the cap having a probe aperture which extends at least part way through one of its walls,
    a U-shaped terminal disposed in the insulator housing which has a bridge portion and depending plates which are disposed adjacent the respective side walls of the insulator housing,
    each of the plates having a slot which is aligned with the slots of the insulator housing, which has an upper V-shaped portion for receiving and positioning an insulated electrical cable across the open top and which has a lower insulation piercing portion of narrow width for piercing the insulation and contacting the conductive core of an insulated electrical cable which is positioned in the V-shaped portion and pushed down into the insulation piercing portion,
    the U-shaped terminal further having a pair of spring fingers which provide a probe contact which is aligned with the probe aperture when the cover is closed, and
    means to retain the cover in the closed position.

2. The diagnostic connector tap as defined in claim 1 wherein the spring fingers are U-shaped and integrally attached to free ends of the respective plates and the probe aperture is located in a front wall of the cap.

3. The diagnostic connector tap as defined in claim 1 wherein the insulator housing and cap contains a sealant gel for sealing the electrical connection between the terminal and the conductive core of an insulated electrical cable to which the diagnostic connector is attached and the diagnostic connector tap includes a thin frangible web which covers the probe aperture.

4. The diagnostic connector tap as defined in claim 1 wherein the insulator housing and the cap have liners which cooperate to seal around the cable and provide an interface seal between the housing and the cap and one of the liners includes a thin frangible web portion which closes the probe aperture.

5. The diagnostic connector tap as defined in claim 1 wherein the spring fingers depend from the bridge portion of the terminal.

6. The diagnostic connector tap as defined in claim 5 wherein the probe aperture is located in a bottom wall of the insulator housing.

7. The diagnostic connector as defined in claim 5 wherein the probe aperture is located in a top wall of the cap.

8. A diagnostic connector tap which is adapted for permanent attachment to an insulated electrical cable for in service testing of the insulated electrical connector by an electrical test probe comprising:
    an insulator housing having front, back and side walls, a bottom wall and an open top;
    a cover which is hinge connected to the back wall of the insulator housing for movement between an open position and a closed position covering the open top of the insulator housing,
    each of the side walls having an elongated slot which communicates with the open top and extends downwardly for receiving an insulated electrical cable,
    each of the elongated slots having a thin sealing web which is slit in the elongated direction of the slot,
    the bottom wall of the housing having a probe aperture which is closed by a thin frangible web,
    a U-shaped terminal disposed in the insulator housing which has a bridge portion and depending plates which are disposed adjacent the respective side walls of the housing,
    each of the plates having a slot which is aligned with the elongated slots of the housing and which has an upper V-shaped portion for positioning an insulated electrical cable and a lower insulation piercing portion of narrow width for piercing the insulation and contacting the conductive core of an insulated electrical cable which is positioned in the V-shaped portion and pushed down into the insulation piercing portion,
    the U-shaped terminal further having a pair of spring fingers depending from the bridge portion to provide a probe contact which is aligned with the probe aperture in the bottom wall of the housing,
    the cover having a depending anvil which fits between the plates for pushing an insulated electrical cable positioned in the V-shaped portion of the slots down into the insulation piercing portion of the slots when the cover is closed,
    means to retain the cover in the closed position, and
    a gel sealant contained in the insulator housing for sealing an electrical connection between the terminal and the conductive core of an insulated electrical cable when the diagnostic connector tap is clamped onto an insulated electrical cable.

9. A diagnostic connector tap which is adapted for permanent attachment to an insulated electrical cable for in service testing of the insulated electrical connector by an electrical test probe comprising:

an insulator housing having front, back and side walls, a bottom wall and an open top;

a cover which is hinge connected to the back wall of the insulator housing for movement between an open position and a closed position covering the open top of the insulator housing, each of the side walls having an elongated slot which communicates with the open top and extends downwardly for receiving an insulated electrical cable, each of the elongated slots having a thin sealing web which is slit in the elongated direction of the slot, the bottom wall of the housing having an internal rib which is parallel to the side walls and closer to one side wall, the bottom wall further having a probe aperture which is located forwardly of the rib and which is closed by a thin sealing web, and a U-shaped terminal disposed in the insulator housing, the U-shaped terminal having a bridge portion which is at the open top of the housing and depending plates which are disposed between the rib and the respective side wall of the housing, one of the plates having claws engaging the rib to retain the terminal in the housing and each of the plates having a slot which is aligned with the elongated slots of the housing and which has an upper V-shaped portion for positioning an insulated electrical cable and a lower insulation piercing portion of narrow width for piercing the insulation and contacting the conductive core of an insulated electrical cable which is positioned in the V-shaped portion and pushed down into the insulation piercing portion, the U-shaped terminal further having a pair of spring fingers depending from the bridge portion to provide a probe contact which is aligned with the probe aperture in the bottom wall of the housing, the cover having a depending anvil which fits through a gap in the bridge portion of the U-shaped terminal and between the plates for pushing an insulated electrical cable positioned in the V-shaped portion of the slots down into the insulation piercing portion of the slots when the cover is closed, means to retain the cover in the closed position, and a gel sealant contained in the insulator housing for sealing an electrical connection between the terminal and the conductive core of an insulated electrical cable when the diagnostic connector tap is clamped onto the insulated electrical cable.

10. A diagnostic connector tap which is adapted for permanent attachment to an insulated electrical cable for in service testing of the insulated electrical cable by an electrical test probe comprising:

an insulator housing having an open top and a cap which is hinge connected to the insulator housing for movement between an open position and a closed position covering the open top, the insulator housing having slots which communicate with the open top for receiving an insulated electrical cable so that is extends through the insulator housing when the cap is in the closed position, one of the insulator housing and the cap having a probe aperture which extends at least part way through one of its walls, a terminal disposed in the insulator housing which has an insulation piercing portion which pierces the insulation and establishes an electrical connection with the insulated electrical cable which extends through the insulator housing, the terminal further including a probe contact which is aligned with the probe aperture when the cover is closed, and means to retain the cover in the closed position and clamp the diagnostic connector tap on the insulated cable.

11. The diagnostic connector tap as defined in claim 10 wherein the insulator housing and cap contains a sealant gel for sealing the electrical connection between the terminal and the conductive core of the insulated electrical cable to which the diagnostic connector is attached and includes a thin frangible web which covers the probe aperture.

12. The diagnostic connector tap as defined in claim 11 wherein the probe aperture is located in a bottom wall of the insulator housing.

13. The diagnostic connector as defined in claim 11 wherein the probe aperture is located in a top wall of the cap.

14. The diagnostic connector tap as defined in claim 11 wherein the probe aperture is located in a front wall of the cap.

15. The diagnostic connector tap as defined in claim 10 wherein the insulator housing is filled with a sealant gel and the terminal is disposed in the housing filled with the sealant gel.

16. The diagnostic connector tap as defined in claim 15 wherein the slots which communicate with the open top have a thin sealing web, the probe aperture is located in a wall of the insulator housing and the probe aperture is closed by a thin frangible web.

17. The diagnostic connector tap as defined in claim 16 wherein the slots which communicate with the open top are elongated and the thin sealing web is slit in the elongated direction of the slot.

18. A connector tap which is adapted for attachment to an insulated electrical cable comprising:

an insulator housing having an open top and a cap which is hinge connected to the insulator housing for movement between an open position and a closed position covering the open top, the insulator housing having slots which communicate with the open top for receiving an insulated electrical cable so that it extends through the insulator housing when the cap is in the closed position, the insulator housing containing a gel sealant and the slots each having a thin sealing web to permit pouring of uncured gel sealant into the insulator housing as a liquid and to facilitate receipt of insulated electrical cable after curing of the gel sealant, a terminal disposed in the insulator housing which has an insulation piercing portion which pierces the insulation and establishes an electrical connection with the conductive core of the insulated electrical cable which extends through the insulator housing, and means to retain the cover in the closed position and clamp the connector tap on the insulated cable.

19. The connector tap as defined in claim 18 wherein the electrical connection is encapsulated in the gel sealant after it is cured.

20. The connector tap as defined in claim 18 wherein the thin sealing webs are slit.

21. The connector tap as defined in claim 20 wherein the electrical connection is encapsulated in the gel sealant after it is cured.

* * * * *